United States Patent
Tsai et al.

(10) Patent No.: US 9,954,067 B2
(45) Date of Patent: Apr. 24, 2018

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Wei-Che Tsai, Hsinchu (TW); Hsin-Hung Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/632,412

(22) Filed: Feb. 26, 2015

(65) Prior Publication Data
US 2016/0254358 A1  Sep. 1, 2016

(51) Int. Cl.
| | |
|---|---|
| H01L 21/321 | (2006.01) |
| H01L 21/768 | (2006.01) |
| H01L 23/535 | (2006.01) |
| H01L 29/417 | (2006.01) |
| H01L 23/485 | (2006.01) |
| H01L 21/285 | (2006.01) |
| H01L 21/8234 | (2006.01) |

(52) U.S. Cl.
CPC ...... *H01L 29/41775* (2013.01); *H01L 21/321* (2013.01); *H01L 21/76834* (2013.01); *H01L 21/76897* (2013.01); *H01L 23/485* (2013.01); *H01L 21/28518* (2013.01); *H01L 21/823475* (2013.01)

(58) Field of Classification Search
CPC ..................... H01L 21/76829; H01L 29/6656
See application file for complete search history.

(56) References Cited

U.S. PATENT DOCUMENTS

| | | | | |
|---|---|---|---|---|
| 2007/0023822 A1* | 2/2007 | Sung | ................ | H01L 29/42324 257/316 |
| 2007/0221981 A1* | 9/2007 | Saeki | .................... | H01L 27/115 257/314 |
| 2013/0299919 A1* | 11/2013 | Chen | ................... | H01L 29/6656 257/408 |

* cited by examiner

*Primary Examiner* — Raj R Gupta
(74) *Attorney, Agent, or Firm* — WPAT, P.C., Intellectual Property Attorneys; Anthony King

(57) ABSTRACT

A semiconductor device includes a gate structure on a substrate; a protection layer on the gate structure; a source/drain region adjacent to the gate structure; and an interconnect plug on the source/drain region. The gate structure includes a gate electrode including a top surface; and a sidewall spacer interfacing a sidewall of the gate electrode. The protection layer covers at least a first portion of the top surface and the sidewall spacer. The protection layer is interposed between the interconnect plug and the gate electrode.

18 Claims, 9 Drawing Sheets

SEMICONDUCTOR DEVICE AND MANUFACTURING METHOD THEREOF

FIELD

The present disclosure relates to a semiconductor device and in particular, to a semiconductor device with a more efficient interconnect plugs and a method of manufacturing a semiconductor device.

BACKGROUND

A significant trend throughout integrated circuit (IC) development is the downsizing of IC components. As the size reduces, the performance requirements become more stringent. Also, as devices continue to shrink in size, the channel region continues to shrink as well. For metal-oxide-semiconductor field effect transistors (MOSFETs), increased performance requirements have generally been met by aggressively scaling the length of the channel region. However, such a short channel length faces high electric field and manufacturing limits.

With regard to the scaling of integrated circuits, the transistors have a scale much smaller than the interconnect plugs. When forming the interconnect plugs, it is difficult to align source/drain terminals with the interconnect plugs due to a larger size of the interconnect plugs. In addition, the interconnect plugs sometimes shift unintentionally. The interconnect plugs are subject to overlap with the gate terminal, which causes a shortage between the source/drain terminals and the gate terminal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
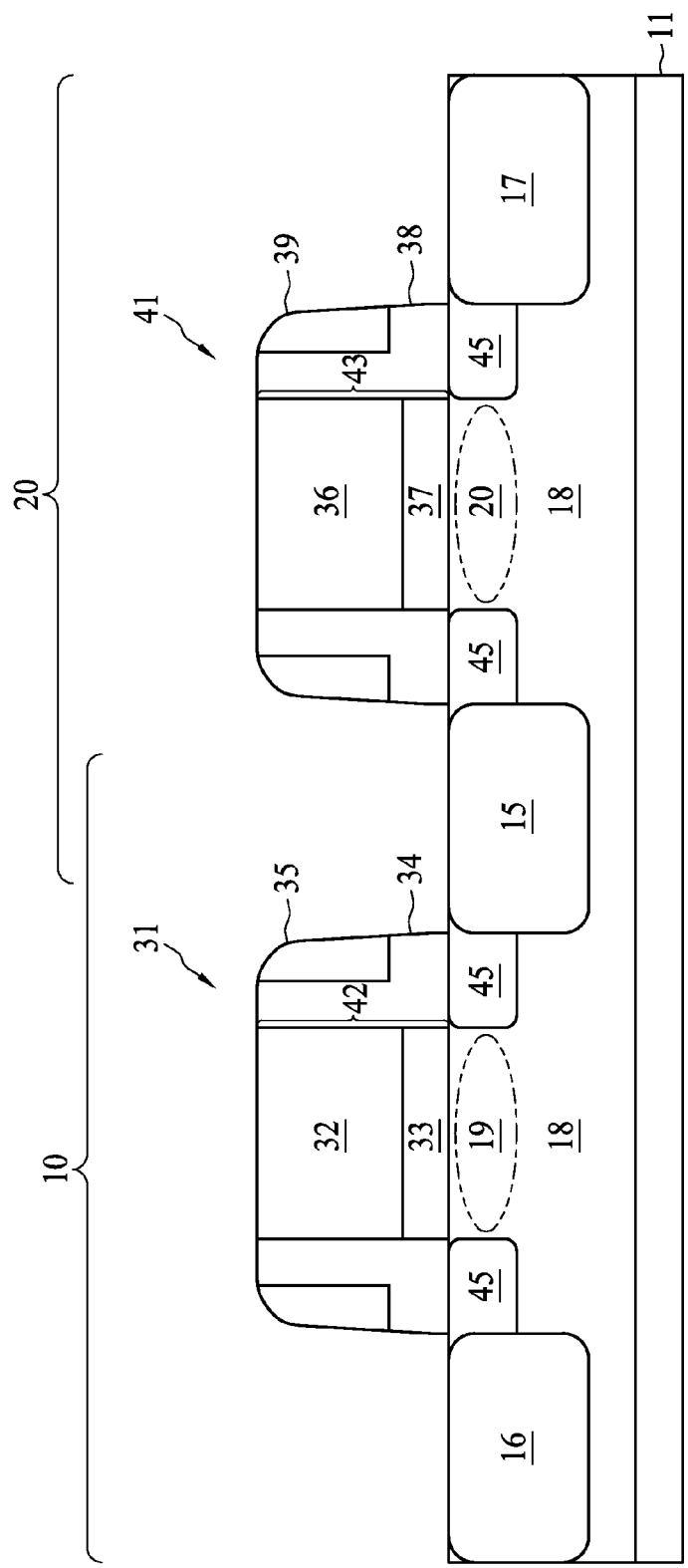
FIGS. 1A-1G represent a method of manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

IC manufacturers have made great effort to improve the performance of NMOS and PMOS transistors. One technique for improving performance is to reduce the channel length of the transistors. As the devices shrink, the source/drain regions also shrink to smaller areas. A contact plug has to align with a top area of the source/drain regions. Since the contact plug has a greater critical dimension, it is difficult to align the contact plug with the source/drain regions and avoid the contact plug overlap shifting. The contact plug has a larger bottom area so that the contact plug may overlap the source/drain regions and partially overlap a gate electrode. In this situation, the gate terminal and the source/drain terminal are electrically connected so as to form a circuit shortage. If the circuit shortage occurs, the device will be unable to work. The present disclosure provides a semiconductor device and a method to manufacture the same, which avoids the circuit shortage between the source/drain terminals and gate terminals as the device shrinks.

FIGS. 1A-1G represent a method of manufacturing a semiconductor device 100 in accordance with some embodiments of the present disclosure. Each figure represents a stage of the method in a cross-sectional perspective view.

Referring to FIG. 1A, two FETs 10 and 20 are arranged side by side, wherein the FETs 10 and 20 also refer to metal-oxide-semiconductor field effect transistors (MOSFETs). The FETs 10 and 20 are implemented as the same type of MOSFETs, for example, a p-type MOSFET or an n-type MOSFET. The FET 10 includes a gate structure 31 on a substrate 11 and source/drain regions 15 and 16 on opposite sides of the gate structure 31; and the FET 20 includes a gate structure 41 on the substrate 11 and source/drain regions 15 and 17 on opposite sides of the gate structure 41. The FETs 10 and 20 commonly share the source/drain region 15 where the FETs 10 and 20 are a part of a SRAM circuit or other kinds of functional circuit. As such, the source/drain regions 15, 16 and 17 are implemented as the same type of doping, for example, a p-type or an n-type doping. Alternatively, in other embodiments, the FETs 10 and 20 can be employed as a complementary metal-oxide-semiconductor (CMOS), wherein the FET 10 and the FET 20 are separated by shallow trench isolations. The FETs 10 and 20 are implemented as different types of MOSFETs, for example, one is a p-type MOSFET and another is an n-type MOSFET.

The substrate 11 is a silicon substrate or made of materials other than silicon, for example, silicon germanium, silicon carbide, germanium, III-V compound semiconductors. In an embodiment, the substrate 11 is made of a silicon-on-insulator (SOI) substrate. The SOI substrate includes a bulk silicon layer, a buried insulation layer and an active layer, wherein semiconductor devices are formed in and above the active layer. The gate structures 31 and 41 are formed on the substrate 11, wherein the substrate 11 includes a doped well 18, isolations (not shown) and channel regions 19 and 20. The gate structure 31 includes a gate electrode 32, a gate dielectric 33, a liner 34 and a sidewall spacer 35. The gate structure 41 includes a gate electrode 36, a gate dielectric 37, a liner 38 and a sidewall spacer 39.

In some embodiments, the isolations are formed in the substrate 11 to define active regions of each device. In addition, the isolations are configured to isolate various devices from one another. The isolations are made of dielectric materials, such as oxide or nitride, by using local oxidation of silicon (LOCOS) or shallow trench isolation (STI). For example, during formation of the STIs, a pad layer and a stop layer (not shown) are formed over the substrate 11. The pad layer primarily serves as a stress buffer layer between the substrate 11 and following layers. The stop layer serves as a protection layer as polishing. By etching through the pad layer and the stop layer, the substrate 11 is then etched to form a plurality of shallow trenches. Later, the shallow trenches are filled with dielectric materials. A polishing process is performed to planarize top surfaces of the dielectric materials, thus forming the isolations. Those skilled in the art shall understand the various steps used to form the isolations.

After forming the isolations, an implantation or a diffusion process (not shown) is performed to form the doped well 18 between the isolations. The doped well 18 includes a p-type dopant or an n-type dopant. In an embodiment, the FETs 10 and 20 are p-type MOSFETs, wherein the doped well 18 is an n-type well. Thus, the doped well 18 includes dopants, for example, phosphorous, arsenic, and/or antimony. In an embodiment, the FETs 10 and 20 are n-type MOSFETs, wherein the doped well 18 is a p-type well. Thus, the doped well 18 includes dopants, for example, boron, germanium, and/or indium. Since the doped well 18 is a foundation for manufacturing devices, channel regions 19 and 20 obtain features of the doped well 18. As such, the channel regions 19 and 20 include a dopant material that is the same as that of the doped well 18.

Later, a gate dielectric layer and a gate electrode layer are deposited and then patterned to form stacks 42 and 43. The stack 42 is made of a gate electrode 32 and a gate dielectric 33; and the stack 43 is made of a gate electrode 36 and a gate dielectric 37. The gate dielectrics 33 and 37 are respectively located on the channel regions 19 and 20. In some embodiments, the gate dielectrics 33 and 37 are made of silicon dioxide or a high dielectric constant (K) material. In some embodiments, the gate dielectrics 33 and 37 include a dielectric material based on silicon oxide, e.g., silicon oxynitride or a stack of at least one silicon oxide and at least one silicon nitride. In some embodiments, the gate dielectrics 33 and 37 include a dielectric metal oxide having a dielectric constant greater than 8.0, which is known as a high-k dielectric material. Exemplary high-k dielectric materials include $HfO_2$, $ZrO_2$, $La_2O_3$, $Al_2O_3$, $TiO_2$, $SrTiO_3$, $LaAlO_3$, $HfO_xN_y$, $Y_2O_3$, $LaAlO_xN_y$, $Al_2O_xN_y$, $ZrO_xN_y$, $La_2O_xN_y$, $TiO_xN_y$, $SrTiO_xN_y$, $Y_2O_xN_y$, and an alloy thereof. Each value of x is independently from 0.1 to 3.0 and each value of y is independently from 0.1 to 2.0.

The gate electrodes 32 and 36 are respectively located on the gate dielectrics 33 and 37. In some embodiments, gate electrodes 32 and 36 include standard polysilicon with doping, which refers to a poly-gate. Alternatively, the gate electrodes 32 and 36 include amorphous silicon material, a metal material, silicide metal material, or a stack of at least one metallic material and at least one semiconductor material. The gate electrodes 32 and 36 serve as gate terminals in order to control the channel regions 19 and 20. The material is chosen to meet the requirement of resistance.

An extension source/drain implant (not shown) is performed on the substrate 11, wherein the gate stacks 42 and 43 serve as a mask during the extension source/drain implant. The implanted dopants are then activated and diffused into the substrate 11 through a heating drive process, resulting in extension source/drains 45. The extension source/drains 45 include a depth of from about 200 angstroms to 800 angstroms. In an embodiment, the depth is in a range from about 100 angstroms to 300 angstroms. The extension source/drains are lightly doped (LDD), medium doped (MDD), or heavily doped (HDD) extension regions. For example, the extension source/drain implant is conducted by using As, Sb, $BF_2$ or B atoms at a dose from about $1\times10^{13}$ to $2\times10^{15}$ atoms/cm$^2$ and energy from about 0.2 to 70 KeV. In an embodiment, the dose is in a range from about from about $1\times10^{14}$ to $1\times10^{16}$ atoms/cm$^2$ and energy from about 0.2 to 50 KeV. Dopants in the extension source/drains 45 are opposite to polarity of the doped well 18. The extension source/drains 45 are utilized to reduce the intensity of electric fields in the channel regions 19 and 20 so as to prevent high electric field. In addition, the extension source/drains 45 reduce the voltage stress at the drains of N-channel transistors to minimize the generation of hot electrons.

Next, several conformal layers of gate sidewall material are deposited on the stacks 42 and 43 in a blanketed fashion by using a CVD process with an appropriate thickness. Thereafter, the conformal layers of gate sidewall material are subjected to an anisotropic etch, thus resulting in liners 34 and 38 and sidewall spacers 35 and 39. The liners 34 and 38 are conformally formed on sidewalls of the gate stacks 42 and 43. Further, the liners 34 and 38 respectively interface the sidewalls of the gate stacks 42 and 43 and the substrate 11, wherein the liners 34 and 38 are formed as an L-shape in a cross-sectional view. Specifically, bottoms of the liners 34 and 38 overlap with the extension source/drains 45, which partially mask the extension source/drains 45 during subsequent implantation. The liners 34 and 38 include an oxide material, such as silicon oxide and/or another suitable dielectric material. The liners 34 and 38 are configured to protect the gate stacks 42 and 43 from being damaged during subsequent processes. The liners 34 and 38 also serve as an adhesion between the gate stacks (42, 43) and outer sidewall spacers (35, 39). The sidewall spacers 35 and 39 interface sidewalls of the liners 34 and 38. In addition, the sidewall spacers 35 and 39 are respectively located on opposite sides of the gate stacks 42 and 43. In some embodiments, the sidewall spacers 35 and 39 include silicon nitride, silicon dioxide, silicon carbide, or silicon oxy-nitride, without limitation. Specifically, the material of the sidewall spacers 35 and 39 are different from the material of the liners 34 and 38. For example, the sidewall spacers 35 and 39 are made of nitride, whereas the liners 34 and 38 are made of oxide.

After forming the gate structures 31 and 41, channel regions 19 and 20 are located underneath the gate structures 31 and 41 and surrounded by the extension source/drains 45. In an embodiment, the channel regions 19 and 20 are n-type and include dopants, for example, phosphorous, arsenic, and/or antimony. In an embodiment, the channel regions 19 and 20 are p-type and include dopants, for example, boron, germanium, and/or indium.

A source/drain implantation (not shown) is performed on the substrate 11 so as to form source/drain regions 15, 16 and 17. The gate structures 31 and 41 serve as masks during the source/drain implantation so as to self-align the source/drain regions 15, 16 and 17. Dopants in the source/drain regions 15, 16 and 17 are opposite to the polarity of the doped well 18. Further, the source/drain implantation is perpendicular to the substrate 11 and includes a concentration in the range of approximately $3 \times 10^{14}$ atoms/cm$^2$ to approximately $8 \times 10^{17}$ atoms/cm$^2$. In an embodiment, the concentration in the range of approximately $1 \times 10^{15}$ atoms/cm$^2$ to approximately $5 \times 10^{18}$ atoms/cm$^2$. In an embodiment, the dopant concentration in the source/drain regions 15, 16 and 17 is higher than that of the extension source/drains 45. As such, the source/drain regions 15, 16 and 17 are formed adjacent to the gate structures 31 and 41, wherein the source/drain regions 15, 16 and 17 have depths greater than that of the extension source/drains 45.

In some embodiments, the source/drain regions 15, 16 and 17 are formed by an etch process and an epitaxial growing process. The etch process is performed to recess the substrate 11 so as to form cavities (not shown) adjacent to the gate structures 31 and 41, wherein the gate structures 31 and 41 serve as masks during the etch process. The cavity is vertically formed into the substrate 11 with a depth, for example, between about 10 nm and about 80 nm. It is also within the scope of the disclosure to etch the cavity to any suitable depth. An epitaxial deposition is then performed to fill up the cavity, thus forming the source/drain regions 15, 16 and 17. The epitaxial deposition includes a precursor, for example, a silicon-containing compound, a germanium-containing compound, and a dopant material. The silicon-containing compound includes, but is not limited to, silane (SiH$_4$), disilane (Si$_2$H$_6$), trisilane (Si$_3$H$_8$), dichlorosilane (SiH$_2$Cl$_2$), and penta-chloro silane. The germanium-containing compound includes, for example, germane (GeH$_4$). Thus, the source/drain regions 15, 16 and 17 include silicon germanium, which provides strain to the channel regions 19 and 20. Alternatively, the source/drain regions 15, 16 and 17 include, for example, silicon carbide, single crystalline silicon or any single crystalline semiconductor material that can be epitaxial-grown. Further, the source/drain regions 15, 16 and 17 are doped in-situ with p-type or n-type dopants during the epitaxial deposition. The in-situ dopant is opposite to the polarity of the channel regions 19 and 20 including, for example, boron, germanium, indium, phosphorous, arsenic, and/or antimony.

Figure 1B:
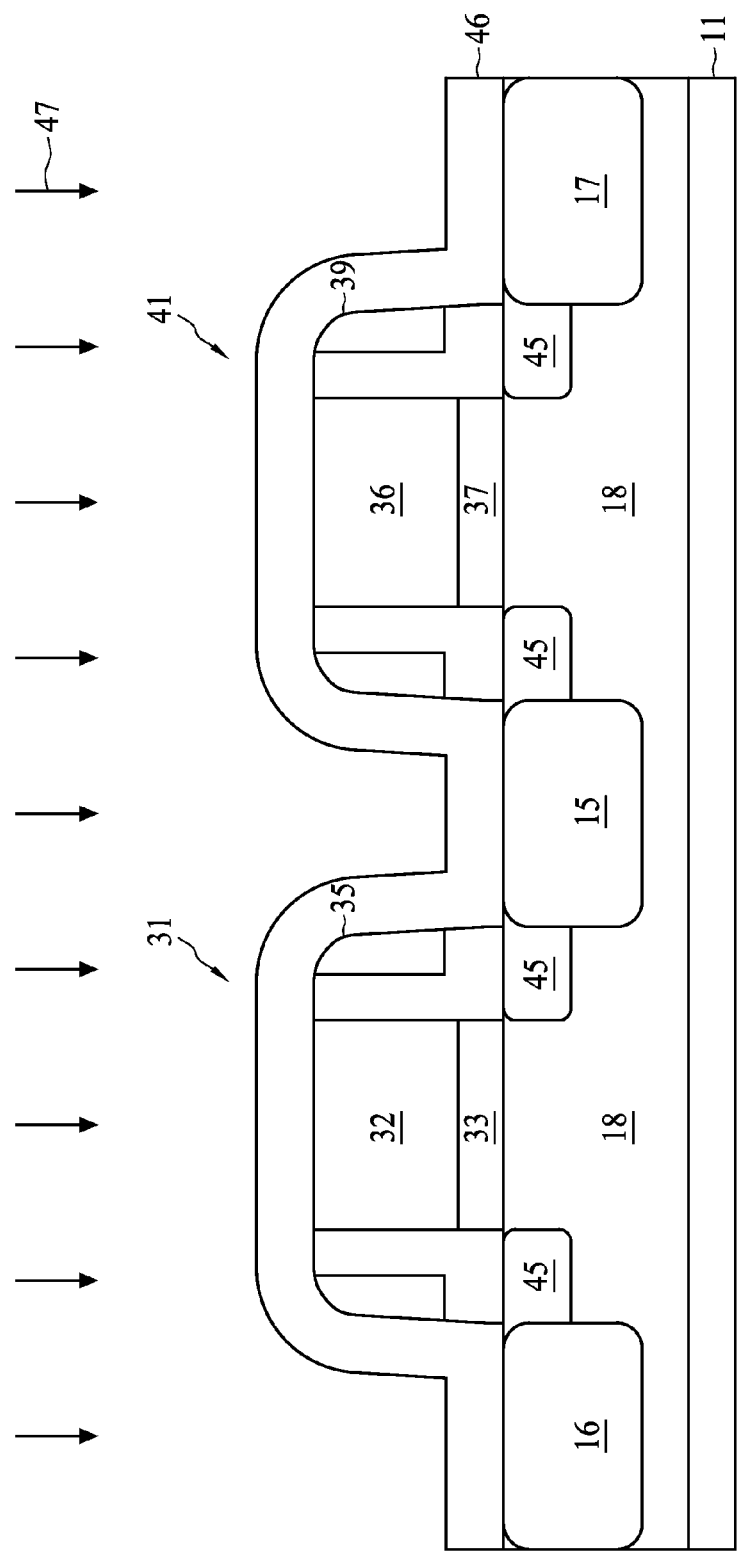

Referring to FIG. 1B, a protection layer 46 is deposited blanketly on the substrate 11 by a deposition 47, wherein the protection layer 46 is conformal to the gate structures 31 and 41. The protection layer 46 covers the gate electrodes (32, 36) and the sidewall spacers (35, 39). The deposition 47 includes a silicon-containing compound, a nitride-containing compound, or other impurities. For example, the deposition 47 has a precursor including SiH$_4$, Si$_2$H$_6$, N$_2$O, or NH$_3$, thus forming an oxynitride layer. The protection layer 46 is made of a dielectric material, for example, silicon oxide, silicon oxynitride, a stack of at least one silicon oxide and at least one silicon nitride, or any other suitable material. The protection layer 46 includes a dielectric material different from that of the sidewall spacers 35 and 39. In addition, the protection layer 46 has a high selectivity to following inter level dielectrics (ILD) in a subsequent etching process.

Figure 1C:
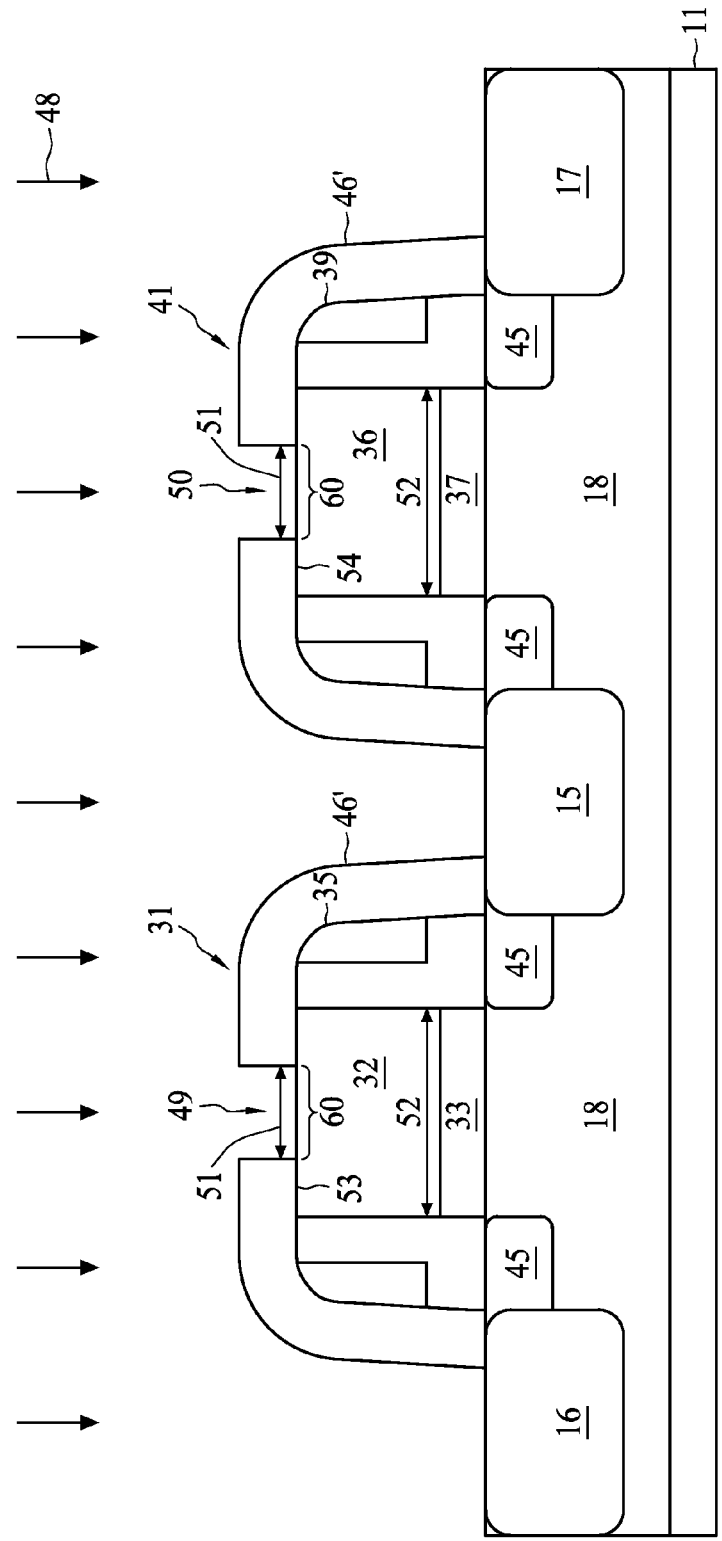

Referring to FIG. 1C, a patterned photoresist (not shown) is formed on the protection layer 46. An etching process 48 is performed to etch the protection layer 46 through the patterned photoresist, thus exposing the source/drain regions 15, 16 and 17 and transforming into a protection layer 46'. The protection layer 46' remains to cover the sidewall spacers (35, 39) and partially the gate electrodes (32, 36). In addition, openings 49 and 50 are formed on the gate electrodes (32, 36). In some embodiments, the openings 49 and 50 include a width 51 smaller than a width 52 of the gate electrodes (32, 36). That is, the openings 49 and 50 partially expose top surfaces 53 and 54 of the gate electrodes (32, 36). The top surfaces 53 and 54 include a portion 60 not in contact with the protection layer 46', wherein the portion 60 includes the width 51 shorter than the width 52 of the gate electrodes (32, 36). The etching process 48 utilizes a wet etching or a dry etching process with an anisotropy feature or an isotropy feature, for example, a reactive ion etches (RIE). The etch process 48 includes a molecule, which is ionized and reacts with materials of the protection layer 46', but not the patterned photoresist. Further, the etch process 48 includes a molecule such as Cl$_2$, SF$_6$, N$_2$, CF$_4$, CHF$_3$, CH$_2$F$_2$, N$_2$H$_2$, O$_2$, He or Ar.

Figure 1D:
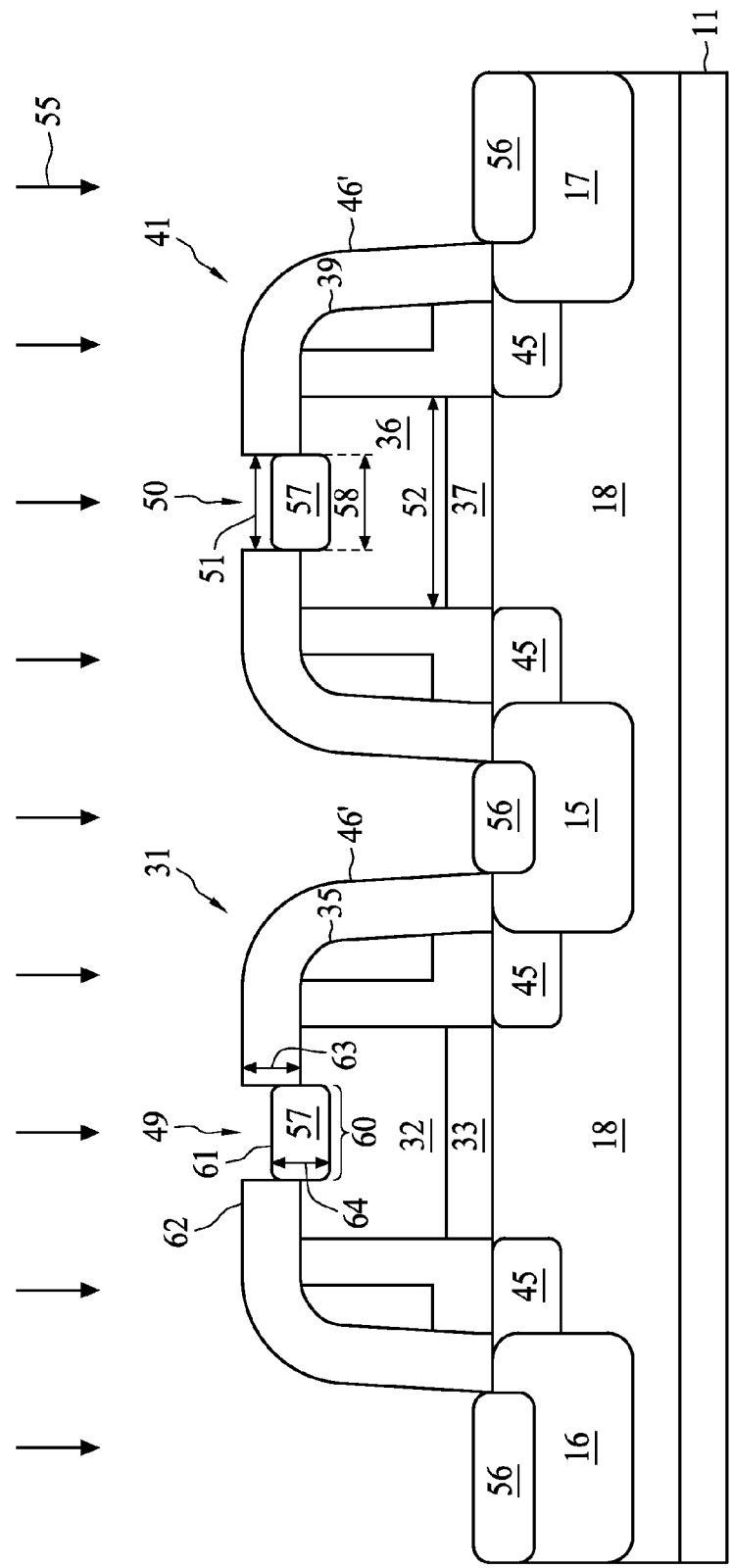

Referring to FIG. 1D, a pre-amorphous implantation (PAI) 55 is performed through the openings 49 and 50 and implant dopants into the gate electrodes (32, 36) and the source/drain regions 15, 16 and 17. The PAI 55 includes dopant species, such as argon or xenon, which are heavy ions with the appropriate inertial properties. Since the PAI 55 includes neutral atoms, the polarity of the source/drain regions 15, 16 and 17 is not changed. The PAI 55 breaks the single crystalline bonding of the source/drain regions 15, 16 and 17 and turns the single crystalline bonding into amorphous bonding. The PAI 55 also breaks the polycrystalline bonding of the gate electrodes (32, 36) into amorphous bonding. Thus, amorphous regions (not shown) are formed in the source/drain regions (15, 16 and 17) and the gate electrodes (32, 36). The PAI 55 includes an energy range from about 2 to 8 KeV. The PAI 55 is controlled in a lower energy range in order to keep the amorphous region at a shallow depth. Doses, energies, and tilt angles may be varied within the spirit and scope of this illustrative embodiment.

During formation of the silicide regions 56 and 57, a metal layer (not shown) is deposited to cover the gate structures (31, 41) and the source/drain regions (15, 16 and 17). The metal layer is in contact with the gate electrodes (32, 36) through the openings 49 and 50, wherein the metal layer contacts with the portion 60 uncovered by the protection layer 46'. Exemplary and non-limiting metals that can be deposited include nickel, platinum or titanium; and the metal thickness is several angstroms, such as about 6 angstroms to about 8 angstroms. Later, an annealing process (not shown) is performed to silicide upper portions of the source/drain regions (15, 16 and 17) and the gate electrodes (32, 36). The silicide regions 56 and 57 are formed from an original interface between the metal layer and the source/drain regions (15, 16 and 17) or the gate electrodes (32, 36). Further, the silicide regions 57 protrude upwardly along the openings 49 and 50 and extend downwardly into the gate electrodes (32, 36). The silicide regions 57 include a width 58 that is the same as the width 51 of the openings 49 and 50. The width 58 is shorter than the width 52 of the gate electrodes (32, 36). The annealing process thus produces silicide regions 56 elevated from the source/drain regions (15, 16 and 17), and silicide regions 57 elevated from the uncovered portion 60. Further, the silicide regions 57 include a top surface level 61 lower than a top surface level 62 of the protection layer 46' so as to avoid any contact with following interconnector plugs. The protection layer 46' includes a thickness 63 in a range of about 200 angstroms to 3000 angstroms. In comparison, the protection layer 46' includes a thickness 63 about 1 to 30 times greater than a thickness 64 of the silicide regions 57. The silicide regions 56 and 57 are made of, for example, NiSi, PtSi or TiSi. Remaining portions of the metal layer are then stripped by a wet etch or a dry etch.

Figure 1E:
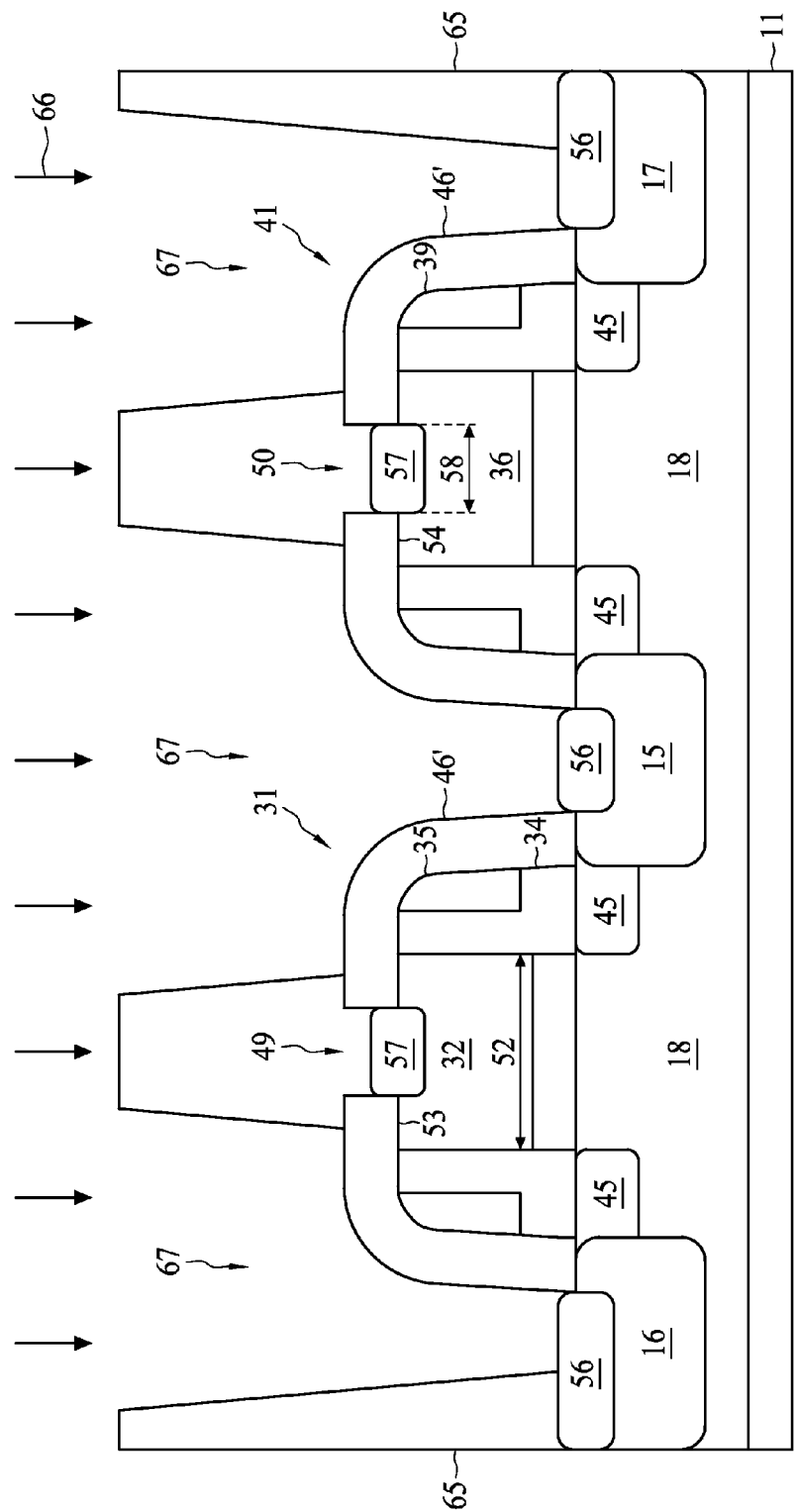

Referring to FIG. 1E, a dielectric material is deposited over the substrate 11 and then patterned to form a dielectric layer 65. When patterning the dielectric layer 65, a photoresist layer (not shown) is applied over the dielectric material. A standard photolithographic technique is performed to pattern the photoresist layer. An etching process 66 is employed through the photoresist layer to form contact openings 67 in the dielectric layer 65. The contact openings 67 align with the source/drain regions (15, 16 and 17) and expose the silicide regions 56. The contact openings 67 have a larger scale than the silicide regions 56, thus further exposing the protection layer 46'. Due to the protection layer 46', the contact opening 67 is allowed to be partially located on the gate electrodes (32, 36). The contact opening 67 is located away from the openings 49 and 50 so as to avoid exposing the silicide regions 56. Since the contact openings 67 include a width greater than a width of the silicide regions 56, there is a risk that an exposure of the silicide regions 57 will unintentionally occur. After following interconnect plugs for the source/drain regions (15, 16 and 17) are formed in the contact openings 67, the silicide regions 57 will connect to the interconnect plug. The exposure of the silicide regions 57 resulting from the contact opening 67 causes an electrical connection between a gate terminal and a source/drain terminal, thereby creating a circuit short in operation. Concerning the circuit short risk, the protection layer 46' covers at least a portion of the gate electrodes (32, 36) so as to narrow down a conductive region. That is, exposed areas of the top surfaces 53 and 54, which have the width 52, are reduced to the width 58 of the silicide regions 57. Since the silicide regions 57 have a smaller exposed area, probability of the circuit short occurring between the gate terminal and the source/drain terminal can be reduced.

The etch process 66 utilizes a wet etching or a dry etching process with an anisotropy feature or an isotropy feature, for example, a reactive ion etch (RIE). The etch process 66 includes a molecule, which is ionized and reacts with materials of the dielectric layer 65, but not the photoresist. Further, the etch process 66 includes a molecule such as $Cl_2$, $SF_6$, $N_2$, $CF_4$, $CHF_3$, $CH_2F_2$, $N_2H_2$, $O_2$, He or Ar. The dielectric layer 65 includes, for example, a layer of borophosphosilicate glass (BPSG), phosphosilicate glass (PSG), or another doped oxide with about 5,000 to 15,000 angstroms in thickness, which also refers to interlayer (or inter-level) dielectric (ILD) layers. The protection layer 46' includes a material different from that of the dielectric layer 65 or the sidewall spacers (35, 39). During the etch process 66, a precursor or a solution of the etch process 66 has a high selectivity between materials of the dielectric layer 65 and the protection layer 46'. The high selectivity causes a higher etching rate on the dielectric layer 65, but a slow etching rate on the protection layer 46'. For example, the protection layer 46' includes a nitride component, such as $SiO_xN_y$ or $Si_xN_y$; the dielectric layer 65 includes a silicon oxide component; and the etch process 66 utilizes a diluted HF solution, which sufficiently etches the silicon dioxide but deficiently etches the protection layer 46'. As such, the protection layer 46' acts as an etch stop layer so as to protect the gate structures 31 and 41 from being encroached. Most of the protection layer 46' remains after the etch process 66 is terminated.

Figure 1F:
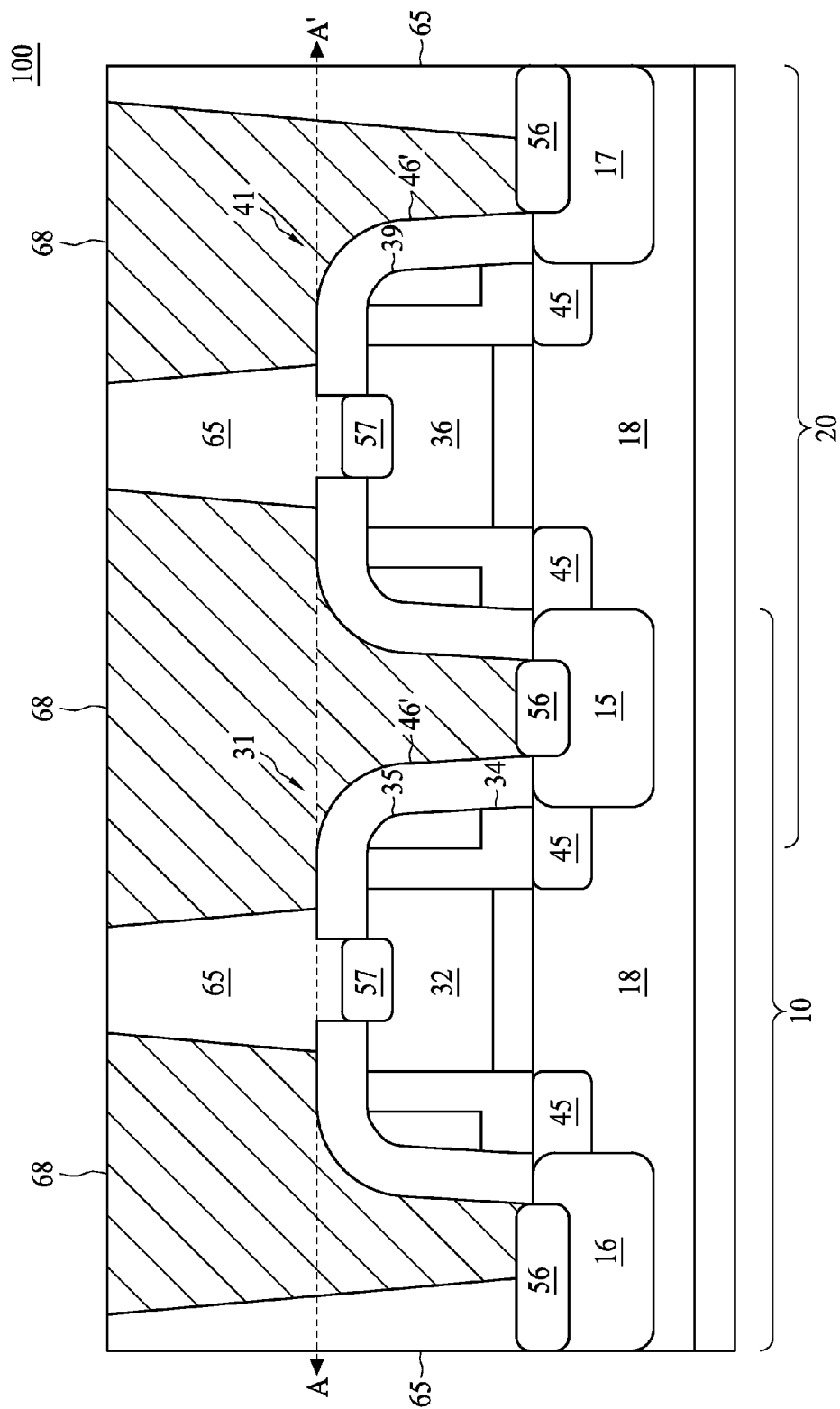

Referring to FIG. 1F, a contact metal layer is deposited in a blanketed fashion into the contact openings 67 so as to be in contact with the silicide regions 56. The contact metal includes copper, aluminum, or tungsten. Later, a polishing process, such as chemical mechanical polishing (CMP), is used to remove uneven portions of the contact metal layer so as to form an interconnect plug 68. The interconnect plug 68 interfaces with the protection layer 46' and the silicide regions 56. Further, the interconnect plug 68 is surrounded by the dielectric layer 65. The interconnect plug 68 provides an electrical connection between the source/drain regions (15, 16 and 17) and outer circuitry. The protection layer 46' is interposed between the interconnect plug 68 and the gate structures (31, 41). After the interconnect plugs 68 are formed, the semiconductor device 100 is accomplished.

Figure 1G:
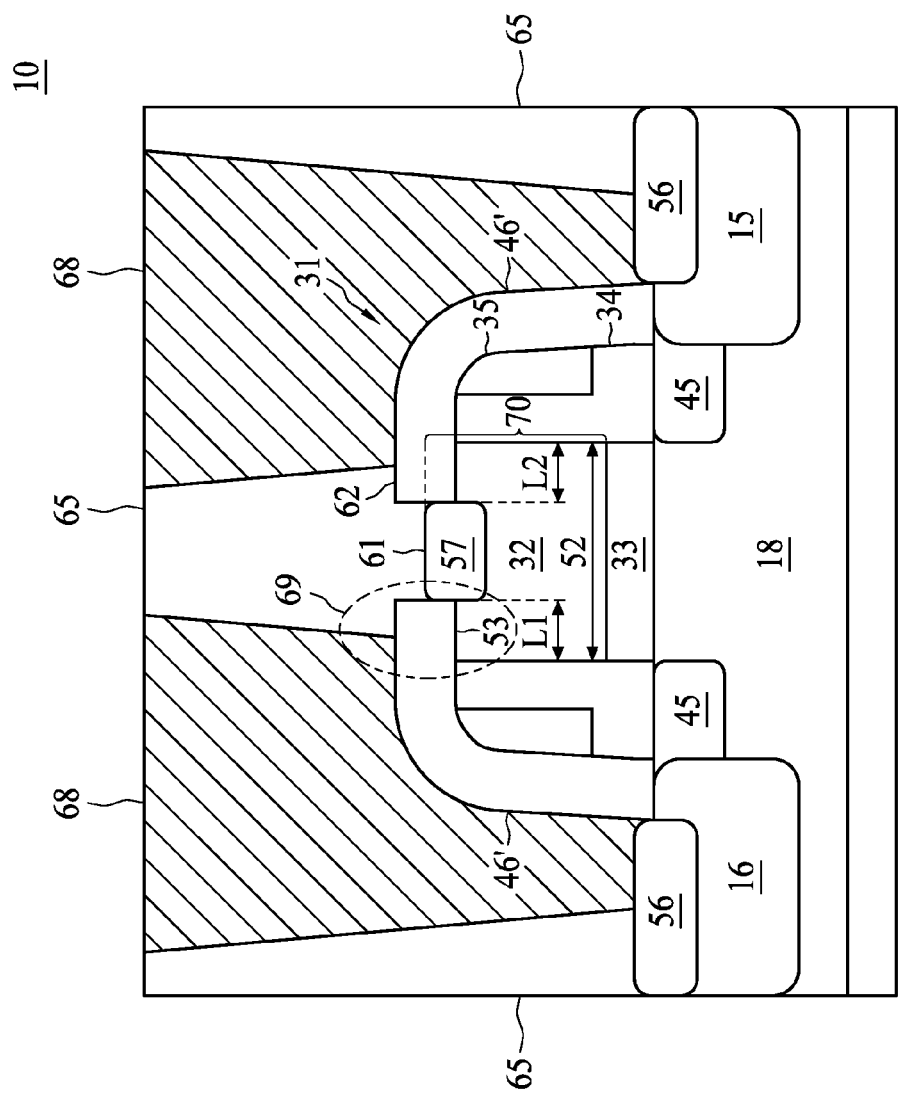

Referring to FIG. 1G, it depicts a zoom-in diagram illustrating the FET 10, wherein a dashed circle 69 refers to relationships of the protection layer 46' with other layers. The protection layer 46' is partially conformal to the gate structure 31, wherein the protection layer 46' interfaces the liner 34 and the sidewall spacer 35. The protection layer 46' extends on the top surface 53 with lengths L1 and L2. The summation of the lengths L1 and L2 is in a range from about 1% to 90% of the width 52. The protection layer 46' is utilized to narrow down the exposed area of the top surface 53, wherein the protection layer 46' on the top surface 53 forms a coverage area in a range about 1% to 90% of the top surface 53. The protection layer 46' thus allows some strict conditions of the interconnect plug 68. For example, strict conditions are caused by a large critical dimension of the interconnect plug 68 where the interconnect plug 68 is subject to be in contact with the gate electrode 32. The protection layer 46' reduces the probability of connection between the interconnect plug 68 and the gate electrode 32. In another example, strict conditions are caused by a shifting of the interconnect plug 68 where the interconnect plug 68 fails to align with the source/drain regions 15 and 16 and shifts incorrectly. The interconnect plug 68 is partially located above the gate electrode 32, but is blocked by the protection layer 46'. The interconnect plug 68 still connects to the silicide regions 56. As such, the protection layer 46' increases the reliability of the interconnect plug 68.

In the dashed circle 69, the protection layer 46' is interposed between the interconnect plug 68 and the gate electrode 32, wherein the protection layer 46' partially shields the gate electrode 32. A partially covered top surface 53 reduces probability of being overlapped by the interconnect plugs 68. Further, the silicide regions 57 include the top surface level 61 which is lower than the top surface level 62 of the protection layer 46'. As such, a conductive portion 70, which includes the silicide regions 57 and the gate electrode 32, is not in contact with the interconnect plug 68. In operation of the FET 10, the protection layer 46' electrically isolates the interconnect plug 68 from the gate electrode 32.

Figure 2:
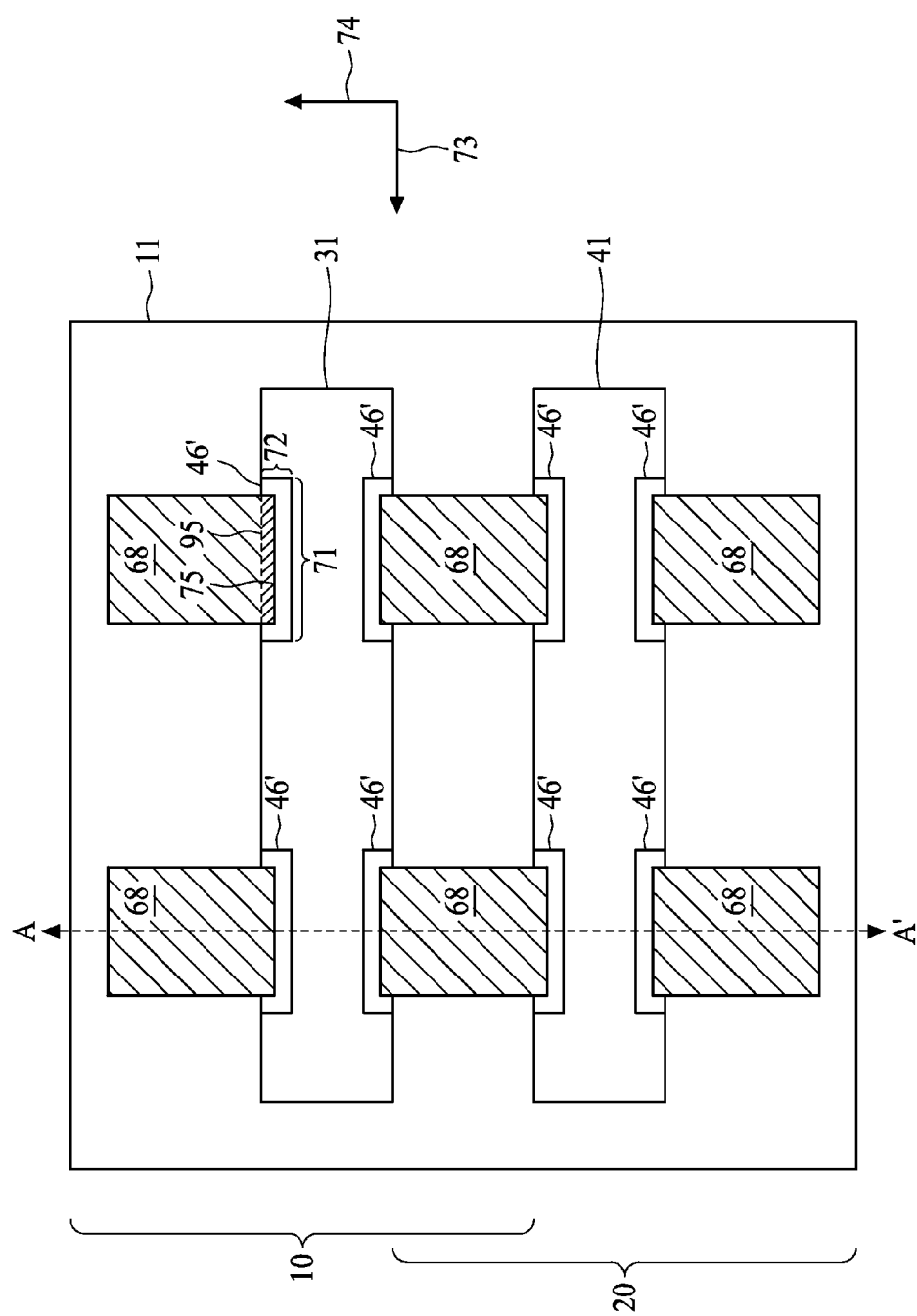
FIG. 2 depicts a layout of the semiconductor device at a top view in accordance with some embodiments of the present disclosure.

FIG. 2 depicts a layout of the FETs 10 and 20 that can be referred as a cross-sectional view along line AA' in FIG. 1F. The gate structures 31 and 41 on the top view are shown as strip lines on the substrate 11, wherein the gate structure 31 is parallel to the gate structure 41 and extends along a direction 73 perpendicular to a channel direction 74. The protection layers 46' are located on the gate structures 31 and 41, wherein the protection layers 46' are shaped as a rectangular shape and overlapped by the interconnect plugs 68. The interconnect plugs 68 are respectively arranged on opposite sides of the gate structures 31 and 41, wherein the interconnect plugs 68 are overlapped with the protection layers 46', but do not extend out of the protection layers 46'. The interconnect plug 68 extends on the gate structure 31 with an area 95, which is smaller than a coverage area of the protection layers 46' on the gate structure 31. Further, the protection layers 46' on the gate structures 31 or 41 have a coverage in a range about 0.5% to 50% on the gate structures 31 or 41. The interconnect plugs 68 on the top view are shown as squares or rectangular on the substrate 11, wherein some of the interconnect plugs 68 are interposed between the gate structures 31 and 41, wherein the interposed interconnect plugs 68 are overlapped with the protection layers 46' of the gate structures 31 and 41. The protection layers 46' includes a long edge 71 and a short edge 72, wherein the long edge 71 is orthogonal to the channel direction 74, whereas the short edge 72 is parallel to the channel direction 74. The long edge 71 is in a range from about 1 nm to 200 nm in length. The short edge 72 is in a range from about 1 nm to 80 nm in width. A ratio between the long edge 71 and the short edge 72 is in a range from about X:X to X:X. The long edge 71 or the short edge 72 is long enough to shield the interconnect plugs 68, wherein the long edge 71 is about 1.1-1.5 times greater than an edge 75 of the interconnect plugs 68. Under the above conditions, the protection layer 46' allows the interconnect plugs 68 to shift slightly and overlap with the gate structures 31 or 41, but not resulting in an electrical connection between gate and source/drain terminals. The protection layers 46' provides a blocking between the interconnect plugs 68 and the gate structures (31, 41) so as to avoid a circuit short. By using the protection layers 46', reliability of the interconnect plugs 68 increases.

Figure 3:
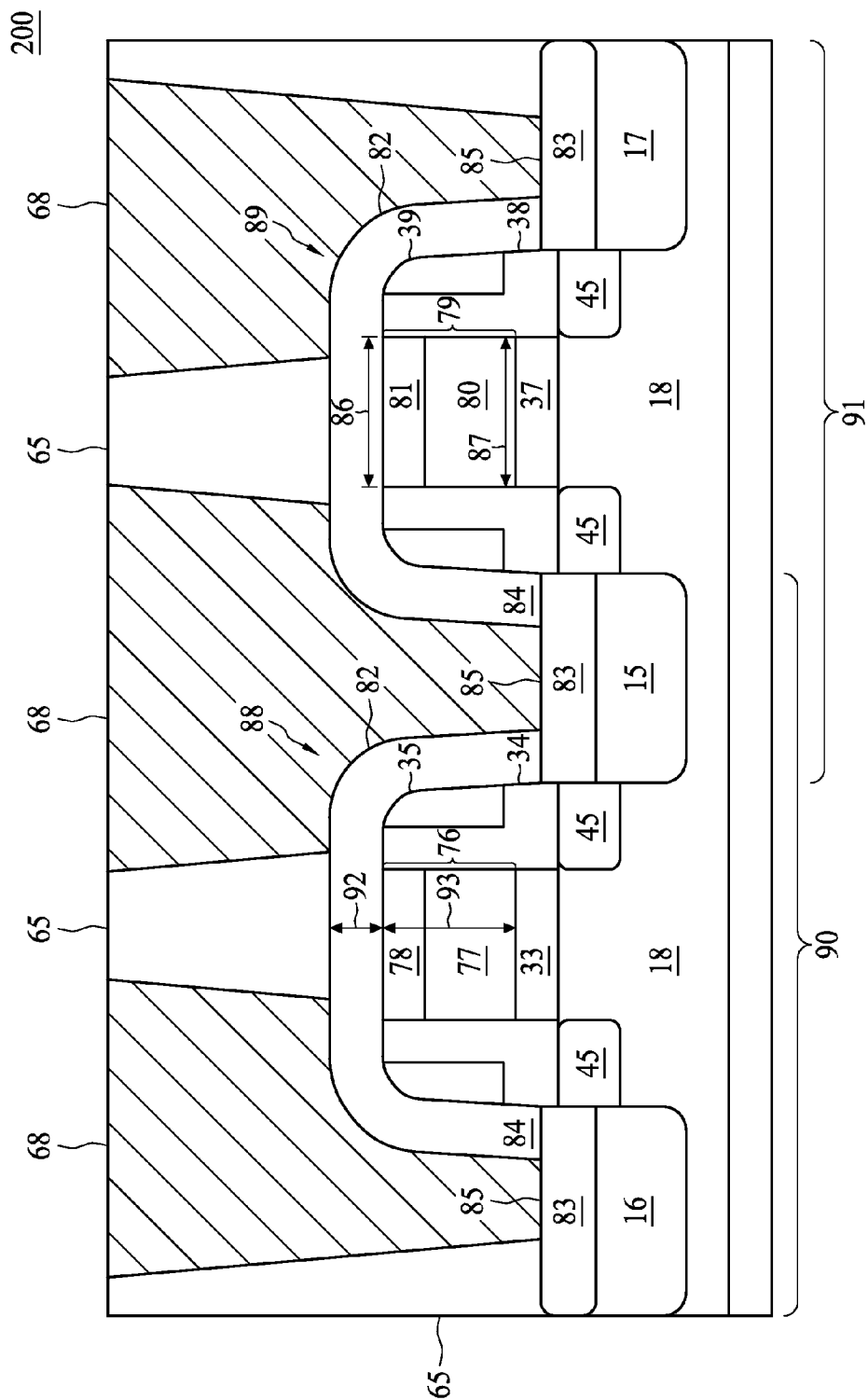
FIG. 3 depicts a semiconductor device in accordance with some embodiments of the present disclosure.

FIG. 3 depicts a semiconductor device 200 in accordance with some embodiments of the present disclosure. The semiconductor device 200 includes two FETs 90 and 91 arranged side by side, wherein the semiconductor device 200 is similar to the semiconductor device 100 in FIG. 1F. In comparison, the difference between the semiconductor devices 100 and 200 is that the semiconductor device 200 has conductive portions 76 and 79, silicide regions 83 and a protection layer 82. The conductive portion 76 includes a gate electrode 77 and a silicide region 78; and the conductive portion 79 includes a gate electrode 80 and a silicide region 81. The silicide regions (78, 81) are elevated from the gate electrodes 77 and 80, wherein the silicide regions (78, 81) have a width 86 that is approximate to a width 87 of the gate electrode 80. The protection layer 82 includes a thickness 92 about 1-4 times greater than a thickness 93 of the conductive portions (76, 79). The silicide regions 83 are elevated from the source/drain regions 15, 16 and 17, wherein the silicide regions 83 have a top surface 85 that is approximate to an original top surface of the source/drain regions 15, 16 and 17. Since the silicide regions (78, 81 and 83) are formed prior to the formation of the protection layer 82, end portions 84 of the protection layer 82 contact with and overlap a portion of the silicide regions 83. In addition, the protection layer 82 is conformal to gate structures 88 and 89 where the silicide regions (78, 81) are blanketed by the protection layer 82. That is, the protection layer 82 covers the conductive portions (76, 79). The gate structures 88 and 89 are coupled with word lines or bit lines (not shown) instead of using interconnect plugs, thus allowing blanket coverage of the protection layer 82. Since the interconnect plugs 68 have a larger scale than the silicide regions (78, 81 and 83), the interconnect plugs 68 are partially located above the conductive portions (76, 79). The protection layer 82 is interposed between the conductive portions (76, 79) and the interconnect plugs 68 so as to provide an electrical isolation. The protection layer 82 prevents the interconnect plugs 68 from coupling with the conductive portions (76, 79). As such, the reliability of forming the interconnect plugs 68 can be increased.

In brief, a protection layer covers at least a portion of the gate electrode so as to prevent a connection between the gate terminal and the source/drain terminal, which causes a circuit shortage. A partially covered top surface of the gate electrode reduces probability of being overlapped by interconnect plugs. As such, the reliability of forming the interconnect plugs can be increased. In addition, the protection layer has a high selectivity to inter layer (or inter-level) dielectrics (ILD) in an etching process so as to protect the gate structures. In an embodiment, the protection layer blankets the conductive portion of the gate structure. The protection layer is interposed between interconnect plugs and the conductive portion so as to prevent a circuit shortage.

A semiconductor device includes a gate structure on a substrate; a protection layer on the gate structure; a source/drain region adjacent to the gate structure; and an interconnect plug on the source/drain region. The gate structure includes a gate electrode including a top surface; and a sidewall spacer interfacing a sidewall of the gate electrode. The protection layer covers at least a first portion of the top surface and the sidewall spacer. The protection layer is interposed between the interconnect plug and the gate electrode.

In some embodiments, the protection layer includes a dielectric material different from that of the sidewall spacer.

In some embodiments, the protection layer extends on the top surface with a total length in a range about 1% to 90% of a width of the gate electrode.

In some embodiments, the protection layer includes a long edge perpendicular to a channel direction that is about 1-1.5 times greater than an adjacent edge of the interconnect plug.

In some embodiments, the protection layer on the top surface forms a coverage area in a range about 1% to 90% of the top surface.

In some embodiments, the protection layer includes a long edge perpendicular to a channel direction and a short edge parallel to the channel direction, and a ratio between the long edge and the short edge is in a range from about 4 to 9.

In some embodiments, the protection layer on the gate structure forms a coverage area in a range about 0.5% to 50% of the gate structure.

In some embodiments, the top surface includes a second portion not in contact with the protection layer, and the second portion includes a width shorter than a width of the gate electrode.

In some embodiments, the gate electrode includes a silicide region elevated from the second portion.

In some embodiments, the silicide layer includes a top surface level lower than a top surface level of the protection layer.

In some embodiments, the protection layer includes a thickness about 1 to 30 times greater than a thickness of the silicide layer.

In some embodiments, the silicide layer includes a width shorter than the width of the gate electrode.

A semiconductor device includes a gate structure located on a substrate; an interconnect plug over the substrate; and an etch stop layer at least partially conformal to the gate structure. The gate structure includes a conductive portion and a sidewall space. The interconnect plug is surrounded by a dielectric layer. The etch stop layer includes a material different from that of the dielectric layer or the sidewall spacer. The interconnect plug is in contact with the etch stop layer.

In some embodiments, the etch stop layer covers the conductive portion.

In some embodiments, the interconnect plug is partially located above the conductive portion. The etch stop layer is interposed between the interconnect plug and the conductive portion.

In some embodiments, the etch stop layer includes a thickness about 1-4 times greater than a thickness of the conductive portion.

A method for manufacturing a semiconductor device includes: providing a substrate includes a gate structure, wherein the gate structure includes a gate electrode; forming a protection layer blanketed on the gate structure; forming a dielectric layer over the substrate and the gate structure; forming a contact opening in the dielectric layer, thus exposing the substrate and at least a portion of the protection layer; and forming a contact material within the contact opening.

In some embodiments, the method further includes forming an opening in the protection layer so as to expose a portion of the gate electrode.

In some embodiments, the method further includes generating an amorphous region in the portion of the gate electrode by a pre-amorphous implanting process; depositing a metal on the amorphous region; and reacting the metal with the amorphous region and forming a silicide layer.

In some embodiments, the contact opening is allowed to partially locate on the gate electrode, and the opening is located away from the contact opening so as to avoid overlapping each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure on a substrate, wherein the gate structure comprises:
   a gate electrode including a top surface;
   a first sidewall spacer interfacing a first sidewall of the gate electrode; and
   a second sidewall spacer interfacing a second sidewall of the gate electrode;
   a first protection layer on the gate structure, wherein the first protection layer covers a first portion of the top surface and the first sidewall spacer;
   a second protection layer on the gate structure, wherein the second protection layer covers a second portion of the top surface and the second sidewall spacer;
   a source region adjacent to a first side of the gate structure;
   a drain region adjacent to a second side of the gate structure;
   a first interconnect plug on the source region, wherein a portion of the first protection layer is interposed between the first interconnect plug and the first portion of the top surface of the gate electrode, and the first protection layer and the first sidewall spacer are composed of different materials, the first protection layer is attached on the first sidewall spacer, the first interconnect plug is attached on the first protection layer, and the first interconnect plug is separated from the first sidewall spacer; and
   a second interconnect plug on the drain region, wherein a portion of the second protection layer is interposed between the second interconnect plug and the second portion of the top surface of the gate electrode, and the second protection layer and the second sidewall spacer are composed of different materials, the second protection layer is attached on the second sidewall spacer, the second interconnect plug is attached on the second protection layer, and the second interconnect plug is separated from the second sidewall spacer.

2. The semiconductor device of claim 1, wherein the first protection layer comprises a dielectric material different from that of the first sidewall spacer.

3. The semiconductor device of claim 1, wherein the first protection layer extends on the top surface with a total length in a range about 1% to 90% of a width of the gate electrode.

4. The semiconductor device of claim 1, wherein the first protection layer comprises a long edge perpendicular to a channel direction that is about 1-1.5 times greater than an adjacent edge of the interconnect plug.

5. The semiconductor device of claim 1, wherein the first protection layer on the top surface forms a coverage area in a range about 1% to 90% of the top surface.

6. The semiconductor device of claim 1, wherein the first protection layer comprises a long edge perpendicular to a channel direction and a short edge parallel to the channel direction, and a ratio between the long edge and the short edge is in a range from about 4 to 9.

7. The semiconductor device of claim 1, wherein the first protection layer on the gate structure forms a coverage area in a range about 0.5% to 50% of the gate structure.

8. The semiconductor device of claim 1, wherein a third portion of the top surface of the gate electrode does not in contact with the first protection layer and the second protection layer, and the third portion of the top surface of the gate electrode comprises a width shorter than a width of the gate electrode.

9. The semiconductor device of claim 8, wherein the gate electrode comprises a silicide region elevated from the third portion of the top surface of the gate electrode.

10. The semiconductor device of claim 9, wherein the silicide layer comprises a top surface level lower than a top surface level of the first protection layer.

11. The semiconductor device of claim 9, wherein the first protection layer comprises a thickness about 1 to 30 times greater than a thickness of the silicide layer.

12. The semiconductor device of claim 9, wherein the silicide layer comprises a width shorter than the width of the gate electrode.

13. A semiconductor device, comprising:
a gate structure located on a substrate, wherein the gate structure comprises a conductive portion, a first sidewall spacer, and a second sidewall spacer;
a first interconnect plug and a second interconnect plug over the substrate, wherein the first interconnect plug and the second interconnect plug are surrounded by a dielectric layer; and
a first etch stop layer and a second etch stop layer partially conformal to a first side and a second side of the gate structure respectively,
wherein the first etch stop layer and the second etch stop layer comprise a material different from that of the first sidewall spacer and second sidewall spacer, and the first interconnect plug is attached on the first etch stop layer, the second interconnect plug is attached on the second etch stop layer, wherein a portion of the first etch stop layer is interposed between the first interconnect plug and a first portion of the conductive portion, a portion of the second etch stop layer is interposed between the second interconnect plug and a second portion of the conductive portion, the first etch stop layer is attached on the first sidewall spacer, the second etch stop layer is attached on the second sidewall spacer, the first interconnect plug is separated from the first sidewall spacer, and the second interconnect plug is separated from the second sidewall spacer.

14. The semiconductor device of claim 13, wherein the first etch stop layer comprises a thickness 1-4 times greater than a thickness of the first conductive portion.

15. The semiconductor device of claim 13, wherein the first etch stop layer covers the first sidewall spacer.

16. The semiconductor device of claim 13, wherein the first etch stop layer comprises a long edge perpendicular to a channel direction that is about 1-1.5 times greater than an adjacent edge of the first interconnect plug.

17. The semiconductor device of claim 13, wherein the first etch stop layer comprises a long edge perpendicular to a channel direction and a short edge parallel to the channel direction, and a ratio between the long edge and the short edge is in a range from about 4 to 9.

18. The semiconductor device of claim 13, wherein the first etch stop layer on the gate structure forms a coverage area in a range about 0.5% to 50% of the gate structure.

* * * * *